(12) United States Patent
Britt

(10) Patent No.: US 10,511,253 B1
(45) Date of Patent: Dec. 17, 2019

(54) SHINGLE SOLAR MODULE WITH INTEGRATED BACKSHEET

(71) Applicant: Global Solar Energy, Inc., Tucson, AZ (US)

(72) Inventor: Jeffrey S. Britt, Tucson, AZ (US)

(73) Assignee: Global Solar Energy, Inc., Tucson, AZ (US)

(*) Notice: Subject to any disclaimer, the term of this patent is extended or adjusted under 35 U.S.C. 154(b) by 0 days.

(21) Appl. No.: 16/437,559

(22) Filed: Jun. 11, 2019

Related U.S. Application Data

(60) Provisional application No. 62/683,487, filed on Jun. 11, 2018.

(51) Int. Cl.
| | |
|---|---|
| *H02S 40/36* | (2014.01) |
| *H02S 20/25* | (2014.01) |
| *H01L 31/05* | (2014.01) |
| *H01L 31/049* | (2014.01) |
| *H01L 31/02* | (2006.01) |

(52) U.S. Cl.
CPC ........ *H02S 20/25* (2014.12); *H01L 31/02008* (2013.01); *H01L 31/049* (2014.12); *H01L 31/05* (2013.01); *H02S 40/36* (2014.12)

(58) Field of Classification Search
CPC ... H01L 31/00; H01L 31/02; H01L 31/02002; H01L 31/02008; H01L 31/02013; H01L 31/02016; H01L 31/02021; H01L 31/0203; H01L 31/042; H02S 20/00; H02S 20/20; H02S 20/22; H02S 20/23; H02S 20/24; H02S 20/25; H02S 40/00; H02S 40/30; H02S 40/34; H02S 40/36
See application file for complete search history.

(56) References Cited

U.S. PATENT DOCUMENTS

| | | | |
|---|---|---|---|
| 8,695,289 B2* | 4/2014 | Koch | E04D 1/26 52/173.3 |
| 2008/0041434 A1* | 2/2008 | Adriani | B23K 31/02 136/244 |
| 2008/0302409 A1* | 12/2008 | Bressler | H02S 20/25 136/251 |
| 2012/0152325 A1* | 6/2012 | Podkin | H01L 31/048 136/251 |

* cited by examiner

*Primary Examiner* — Christina Chern
(74) *Attorney, Agent, or Firm* — Kolitch Romano LLP

(57) ABSTRACT

A photovoltaic module may include a plurality of photovoltaic shingles disposed on and electrically interconnected by an integrated backsheet, to which are attached a plurality of electrically conductive shingle connectors. A plurality of photovoltaic shingles may be installed upon a roof and electrically interconnected in a single step by aligning openings in the shingles with apertures in the backsheet, simplifying module installation. The photovoltaic module may mimic the appearance of asphalt shingles and may be integrated within a roof of a house or other structure. Photovoltaic shingles or arrays of photovoltaic shingles can be pre-manufactured for easier installation or constructed at the application site.

20 Claims, 9 Drawing Sheets

SHINGLE SOLAR MODULE WITH INTEGRATED BACKSHEET

CROSS-REFERENCES

This application claims the benefit under 35 U.S.C. § 119(e) of the priority of U.S. Provisional Patent Application Ser. No. 62/683,487, filed Jun. 11, 2018, the entirety of which is hereby incorporated by reference for all purposes.

FIELD

This disclosure generally relates to solar power modules. Specifically, it relates to rooftop solar power modules.

INTRODUCTION

A significant fraction of rooftop space suitable for photovoltaic applications is found on residential buildings. However, several factors determine whether a particular type of solar power module is practical for use in residential rooftops. For example, the owners of residential buildings are likely to consider the cost of purchasing and installing the solar power module, the ability of the roof and/or solar power module to protect the building from the environment, and the aesthetic appearance of the solar power module. Accordingly, there is a need for a rooftop solar power module that satisfies these concerns.

SUMMARY

The present disclosure provides systems, apparatuses, and methods relating to a photovoltaic module having a plurality of photovoltaic modules disposed on and electrically interconnected by an integrated backsheet. In some embodiments, a photovoltaic module may comprise: a weatherable backsheet including: a plurality of electrically conductive shingle connectors embedded within the backsheet; and a plurality of backsheet openings, each opening exposing portions of two of the electrically conductive shingle connectors on a front side of the backsheet; and a plurality of flexible photovoltaic shingles configured to be disposed on the front side of the backsheet, each shingle including: a flexible substrate having an opening in a back side; a plurality of photovoltaic cells disposed on a front surface of the substrate; and a plurality of conductive traces disposed between the front side of the substrate and the photovoltaic cells, the traces defining a conductive path electrically interconnecting the photovoltaic cells, and further defining a positive terminal and a negative terminal accessible through the opening in the back side of the flexible substrate; wherein each opening in the back side of the flexible substrate of one of the shingles is configured to be aligned with a respective one of the backsheet openings, thereby electrically connecting the shingle connectors to the positive and negative terminals of each shingle and electrically connecting the shingles to each other, when the shingles are disposed on the front side of the backsheet.

In some embodiments, a photovoltaic module may comprise: a plurality of flexible photovoltaic shingles, each including: a flexible substrate having an opening in one side; a plurality of photovoltaic cells disposed on a side of the substrate opposite the opening; and a plurality of conductive traces disposed between the substrate and the photovoltaic cells, the traces electrically interconnecting the photovoltaic cells, and defining a positive terminal and a negative terminal associated with the interconnected cells and accessible through the opening in the substrate; and a multi-layer flexible backsheet including: a plurality of electrically conductive shingle connectors disposed between layers of the backsheet; and a plurality of backsheet apertures, each aperture exposing portions of two of the shingle connectors on one side of the backsheet; wherein each opening in the flexible substrate of one of the shingles is configured to be aligned with a respective one of the backsheet apertures when the shingles are disposed on the backsheet, thereby electrically connecting the shingle connectors of the backsheet to the positive and negative terminals of each shingle and electrically connecting the shingles to each other.

In some embodiments, a photovoltaic module may comprise: a plurality of flexible photovoltaic shingles, each including: a flexible substrate; a plurality of photovoltaic cells disposed on one side of the substrate; a plurality of conductive traces disposed between the substrate and the photovoltaic cells, the traces electrically interconnecting the photovoltaic cells and defining a positive terminal and a negative terminal associated with the interconnected cells; and an opening formed in the flexible substrate on a side opposite the photovoltaic cells, the opening providing access to the positive and negative terminals; and a multi-layer flexible backsheet including: a plurality of electrically conductive shingle connectors disposed between layers of the backsheet; and a plurality of backsheet apertures, each aperture exposing portions of two of the shingle connectors on one side of the backsheet; and a plurality of backsheet apertures, each aperture exposing portions of two of the shingle connectors on one side of the backsheet; wherein each opening in the flexible substrate of one of the shingles is configured to be aligned with a respective one of the backsheet apertures when the shingles are disposed on the backsheet, thereby electrically connecting the shingles to each other.

Features, functions, and advantages may be achieved independently in various embodiments of the present disclosure, or may be combined in yet other embodiments, further details of which can be seen with reference to the following description and drawings.

DETAILED DESCRIPTION

Figure 1:
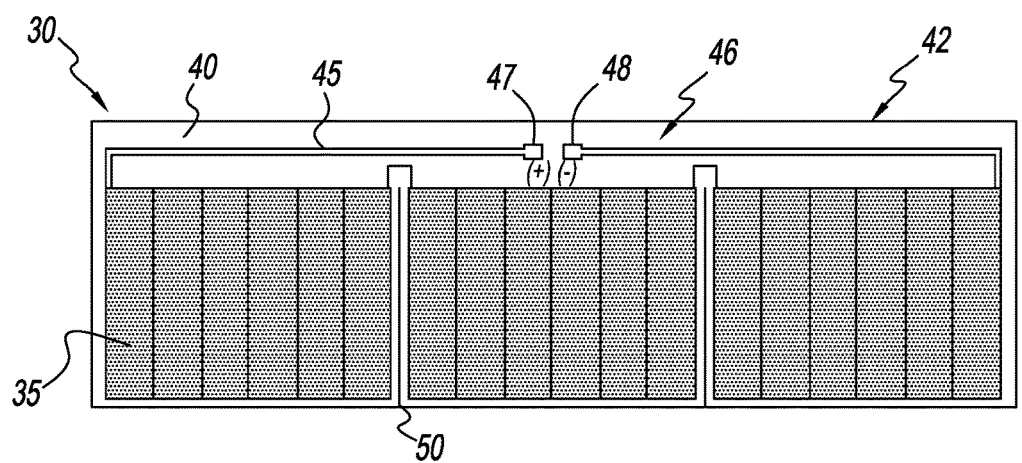
FIG. 1 is a front view of an illustrative photovoltaic shingle including photovoltaic cells, in accordance with aspects of the present teachings.

Various aspects and examples of a photovoltaic module having a plurality of flexible photovoltaic shingles disposed on and electrically interconnected by an integrated backsheet, as well as related methods, described below and illustrated in the associated drawings. Unless otherwise specified, a photovoltaic module in accordance with the present teachings, and/or its various components, may contain at least one of the structures, components, functionalities, and/or variations described, illustrated, and/or incorporated herein. Furthermore, unless specifically excluded, the process steps, structures, components, functionalities, and/or variations described, illustrated, and/or incorporated herein in connection with the present teachings may be included in other similar devices and methods, including being interchangeable between disclosed embodiments. The following description of various examples is merely illustrative in nature and is in no way intended to limit the disclosure, its application, or uses. Additionally, the advantages provided by the examples and embodiments described below are illustrative in nature and not all examples and embodiments provide the same advantages or the same degree of advantages.

This Detailed Description includes the following sections, which follow immediately below: (1) Definitions; (2) Overview; (3) Examples, Components, and Alternatives; (4) Advantages, Features, and Benefits; and (5) Conclusion. The Examples, Components, and Alternatives section is further divided into subsections A through F, each of which is labeled accordingly.

Definitions

The following definitions apply herein, unless otherwise indicated.

"Substantially" means to be more-or-less conforming to the particular dimension, range, shape, concept, or other aspect modified by the term, such that a feature or component need not conform exactly. For example, a "substantially cylindrical" object means that the object resembles a cylinder, but may have one or more deviations from a true cylinder.

"Comprising," "including," and "having" (and conjugations thereof) are used interchangeably to mean including but not necessarily limited to, and are open-ended terms not intended to exclude additional, unrecited elements or method steps.

Terms such as "first", "second", and "third" are used to distinguish or identify various members of a group, or the like, and are not intended to show serial or numerical limitation.

"AKA" means "also known as," and may be used to indicate an alternative or corresponding term for a given element or elements.

"Coupled" means connected, either permanently or releasably, whether directly or indirectly through intervening components.

Directional terms such as "up," "down," "vertical," "horizontal," and the like should be understood in the context of the particular object in question. For example, an object may be oriented around defined X, Y, and Z axes. In those examples, the X-Y plane will define horizontal, with up being defined as the positive Z direction and down being defined as the negative Z direction.

Overview

In general, a photovoltaic module in accordance with the present teachings may include a plurality of electrically interconnected flexible photovoltaic shingles disposed on a flexible backsheet.

A first photovoltaic shingle of the plurality of photovoltaic shingles may include a plurality of photovoltaic cells disposed on a front surface of a photovoltaic shingle substrate. The shingle may further include conductive traces disposed between the front surface of the shingle substrate and the plurality of photovoltaic cells. The conductive traces may define a conductive path electrically interconnecting the photovoltaic cells. The conductive traces may further define a positive terminal and a negative terminal. The substrate of the photovoltaic shingle may include a substrate opening through which the positive and negative terminal are accessible. The photovoltaic shingle may include any suitable number of photovoltaic cells. Each shingle may include protective barrier layers disposed on a front surface of the photovoltaic cells. Additional photovoltaic shingles of the plurality of photovoltaic shingles are substantially identical to the first photovoltaic shingle.

The flexible, multi-layered backsheet may include a first and a second polymer film, with electrically conductive shingle connectors disposed between the first and the second polymer films. The first film may form a front layer of the backsheet, and the second film may form a back layer of the backsheet. The front layer of the backsheet may have a plurality of backsheet apertures, each aperture exposing at least one portion of at least one of the electrically conductive shingle connectors. In the preferred embodiment, each backsheet aperture exposes portions of at least two shingle connectors.

Aligning the substrate opening of the first photovoltaic shingle with a first backsheet opening of the backsheet may align the positive and negative terminals of the shingle with the shingle connectors of the backsheet, thereby electrically connecting the shingle to the backsheet. Aligning a second substrate opening of a second photovoltaic shingle of the plurality of photovoltaic shingles with a second backsheet opening of the backsheet may electrically connect the second shingle to the backsheet and may electrically interconnect the first and second photovoltaic shingles.

Each photovoltaic shingle may be electrically and physically attached to the backsheet. The positive and negative terminals may be connected to the shingle connectors using conductive adhesive, conductive tape, soldering, or welding. Each shingle may be physically attached to the backsheet using lamination or adhesive. In some embodiments, photovoltaic shingles are manufactured without protective barrier layers. The shingles are then electrically connected to the backsheet using welded or soldered connections. Protective barrier layers are then added to the photovoltaic module and the entire module is laminated as a single structure.

The backsheet may further include electrical module connectors disposed between the front and back layer of the backsheet. The electrical module connectors may comprise conductive ribbon and may extend across a lateral dimension of the module. The electrical module connectors and the electrically conductive shingle connectors may be connected to a junction box disposed on the backsheet. The electrical module connectors may define a module anode and a module cathode. In some embodiments, bypass diodes are included in each shingle in place of a module junction box. In these embodiments, the electrically conductive shingle connectors may define the module anode and the module cathode.

A plurality of photovoltaic modules according to the present disclosure may be arranged in a multi-module array or assembly. The array or assembly may form part of a roof of a residential building or structure. The modules may be arranged such that PV shingles of a first module abut PV shingles of a second module. Backsheets of adjacent photovoltaic modules may overlap. Each backsheet may alternatively overlay a roofing membrane disposed on decking of a roof including the photovoltaic array. The backsheets may be attached to the decking using adhesive, tape, nails, or any other suitable mechanism. The photovoltaic array may include non-functional gap shingles or gap modules that mimic the appearance of functioning PV shingles or of traditional roof shingles. These gap shingles may allow the PV assembly to be included in irregularly-shaped roofs.

In general, a method for manufacturing a photovoltaic module in accordance with the present teachings may include manufacturing photovoltaic shingles or photovoltaic submodule, manufacturing a backsheet including integrated shingle connections, electrically connecting the photovoltaic shingles to the backsheet, and mechanically connecting the photovoltaic shingles to the backsheet.

In general, a method for installing a photovoltaic assembly according to the present disclosure may include attaching a first row of roofing membranes to a roof decking and attaching a first row of photovoltaic shingle modules over the first row of roofing membranes. In some embodiments, a second row of roofing membranes is attached to the roof decking, followed by a second row of shingle modules being attached to the second row of roofing membranes. This method may be repeated as needed to cover a rooftop or portions of a rooftop.

Examples, Components, and Alternatives

The following sections describe selected aspects of exemplary photovoltaic modules including a plurality of flexible photovoltaic shingles disposed on and electrically interconnected by an integrated backsheet as well as related systems and/or methods. The examples in these sections are intended for illustration and should not be interpreted as limiting the scope of the present disclosure. Each section may include one or more distinct embodiments or examples, and/or contextual or related information, function, and/or structure.

A. Illustrative Photovoltaic Module

As shown in FIGS. 1-9, this section describes an illustrative photovoltaic module. The illustrative photovoltaic module is an example of a photovoltaic module including a plurality of flexible photovoltaic shingles disposed on and electrically interconnected by an integrated backsheet, as generally described above.

FIG. 1 depicts a flexible photovoltaic (PV) shingle 30 suitable for inclusion in a PV module, according to aspects of the present teachings. Flexible PV shingle 30 includes one or more PV cells 35 (also called solar cells) supported by a flexible substrate 40. Substrate 40 has a front side 42 and a back side 43, with PV cells 35 being disposed on front side 42 of substrate 40. PV cells 35 may be attached to substrate 40 using adhesive, tape, lamination, or any other suitable alternative low-profile method of attachment.

Some or all of PV cells 35 are electrically connected to other cells 35 on the same shingle 30. In some embodiments, PV cells 35 are electrically connected to each other in series. The electrical connections are formed by conductive traces 45 included in or on substrate 40. Conductive traces 45 form and define an electrically conductive path 46 including PV cells 35, a positive terminal 47, and a negative terminal 48. Positive terminal 47 and negative terminal 48 may include contact pads suitable for soldering or welding to a conductive material. As described in more detail below, positive terminal 47 and negative terminal 48 may be accessible through an opening in the back side of the cell substrate. Conductive traces 45 may be formed of copper, conductive ink, or any other material suitable to conduct electricity between PV cells 35. In one embodiment, PV cells 35 are connected by integrated cell interconnect structures or techniques, e.g., the structures or techniques disclosed in US 2016/0056319 A1. PV cells 35 may be thin film cells.

In some embodiments, three PV cells 35 are arranged in a row on flexible substrate 40, such that PV shingle 30 resembles a standard three-tab roofing shingle. In other embodiments, a different number of PV cells 35 is included, and/or PV cells 35 are arranged in a different configuration. In some embodiments, substrate 40 includes cuts 50 extending from a free edge of substrate 40 between adjacent PV cells 35 to interior portions of substrate 40. Cuts 50 may give PV shingle 30 a textured or three-dimensional appearance that is typically regarded as desirable in roofing shingles, and may also enable air circulation around PV shingle 30. Increased air circulation around PV shingle 30 may enable a lower normal operating cell temperature and thereby tend to increase power produced by shingle 30.

PV shingle 30 may include top protective layers disposed on a front surface of the PV shingle. The top protective layers may include one or more adhesive layers, a transparent vapor barrier layer, a Fluoropolymer top sheet, and/or any alternative transparent films or layers that improve shingle durability without significantly obscuring the front surface of the shingle. PV shingle 30 may be laminated to join all or any subset of these layers together.

Figure 2:
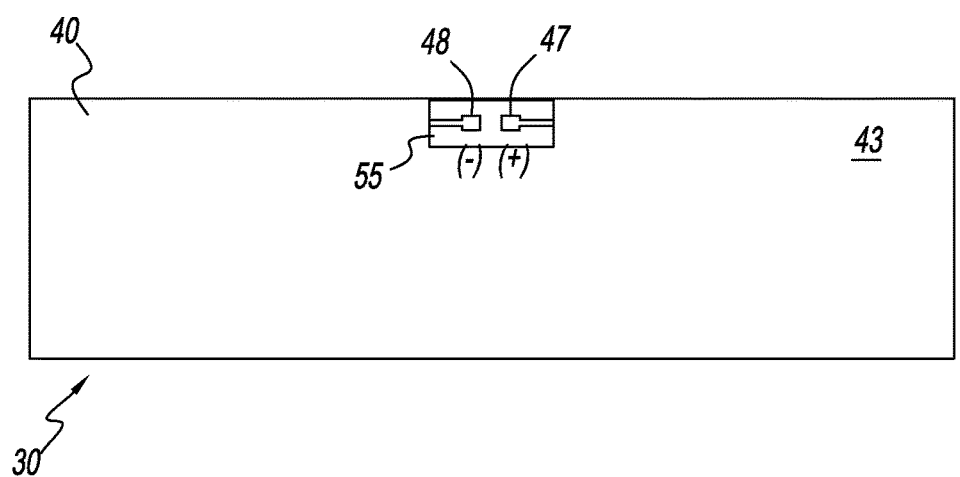
FIG. 2 is a back view of a photovoltaic shingle.

FIG. 2 is a back view of flexible PV shingle 30, with back side 43 visible. Back side 43 includes an opening 55 exposing positive terminal 47 and negative terminal 48. Opening 55 facilitates electrical connection of one PV shingle 30 to one or more other PV shingles 30, as described below with reference to FIGS. 3-4.

Figure 3:
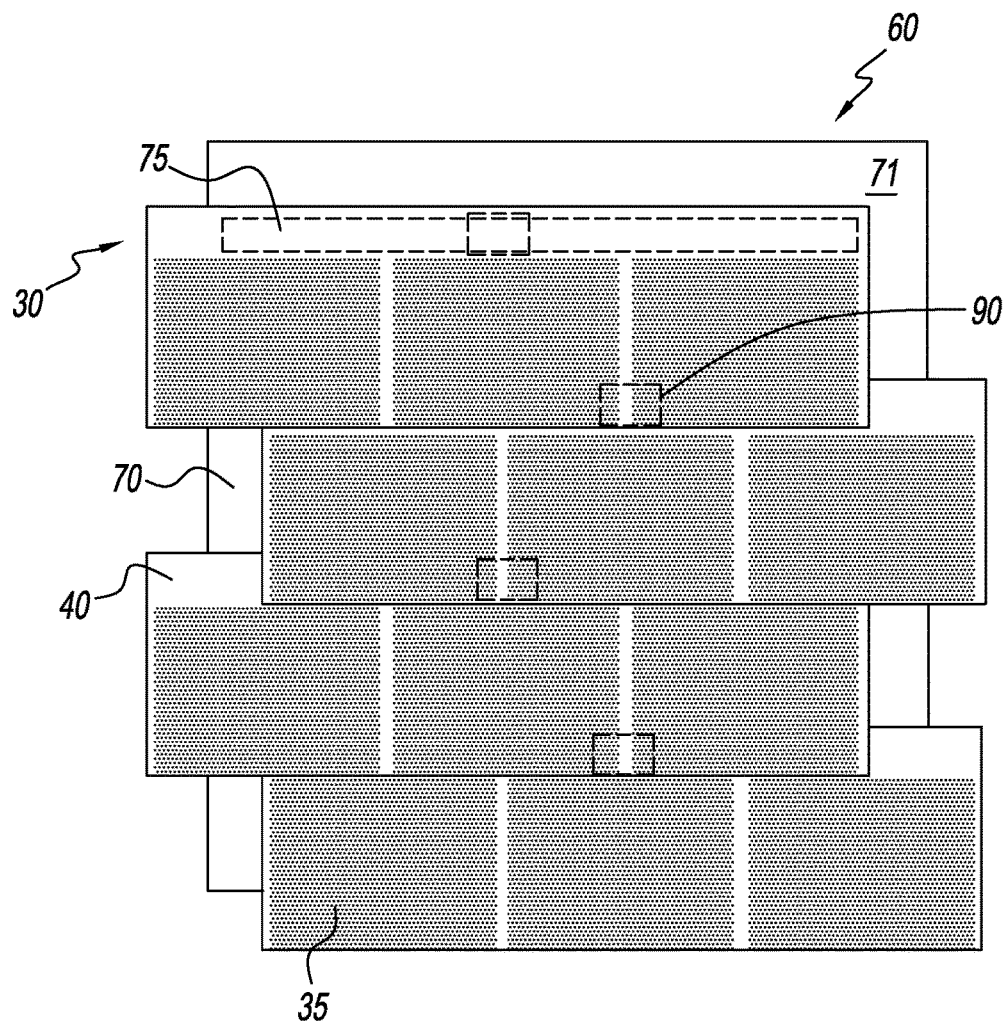
FIG. 3 is a front view of an illustrative photovoltaic module including photovoltaic shingles attached to a backsheet.

FIG. 3 depicts an illustrative PV shingle module 60 including several PV shingles 30 attached to a backsheet 70. In the embodiment depicted in FIG. 3, PV shingles 30 are disposed in rows on a front side or surface 71 of backsheet 70, each row including a single PV shingle 30, but other embodiments are possible (see e.g. FIGS. 9-10). Backsheet 70, which may also be called a backplane or backplane sheet, is made of material with high durability and high dielectric strength. For example, backsheet 70 may be made of a polymer material such as polypropylene, ethylene propylene diene monomer (EPDM), ethylene propylene monomer (EPM), silicone rubber (SR), EPDM/silicone rubber alloys, TPO, PVC, or bitumen. In one embodiment, backsheet 70 includes two polymer films adhered together (one on top of the other), with electrically conductive shingle connectors in the form of conductive ribbon disposed between the two films; this embodiment is discussed below with reference to FIG. 5. Backsheet 70 protects roofing materials underneath it from moisture and other environmental hazards and thus serves as a functional underlayment for the roof in which PV shingle module 60 is included.

One or more PV shingles 30 is attached mechanically and connected electrically to backsheet 70 to form PV shingle module 60. In the embodiment depicted in FIG. 3, PV shingles 30 include an attachment area 75 extending along an upper edge of the shingle. In this embodiment, attachment area 75 is attached to backsheet 70, and no other portion of PV shingle 30 is directly attached to backsheet 70. In other words, each shingle is configured only to be attached to the backsheet at its respective area. This may help PV shingle module 60 to resemble traditional roofing components in appearance, and may facilitate air circulation around PV shingles 30, leading a lower normal operating cell temperature for the PV cells 35. Additionally, unattached portions of PV shingle 30 can be lifted up away from backsheet 70 to allow access to the backsheet when installing PV shingle module 60 on the structure and/or when performing maintenance or repairs on the module or other parts of the roof. The ability to lift PV shingles 30 enables many options for the placement of nails, staples, or other mechanisms for attaching backsheet 70 to a roof, and allows the use of nails, staples, or other penetrative attachment mechanisms without risking damage to the PV shingles.

In some embodiments, additional portions of PV shingle 30 (for example, portions of back side 43 underneath PV cells 35) are also directly attached to backsheet 70 for a more secure attachment. Attachment area 75 or other portions of PV shingle 30 may be attached to backsheet 70 by lamination or adhesive (e.g. pressure-sensitive, heat-cured adhesive or PSA). In some cases, mechanical supports may be configured to support PV shingle 30 at a slight elevation above backsheet 70, thereby facilitating air circulation between the shingle and the backsheet.

Flexible photovoltaic shingles 30 may be disposed on backsheet 70 such that they at least partially overlap with each other. In some embodiments, PV shingles 30 overlap each other such that attachment area 75 on at least some PV shingles 30 is concealed. As depicted in FIG. 3, PV shingles 30 may also be disposed such that they extend beyond at least one edge of backsheet 70 and therefore overlap a backsheet 70 of an adjacent PV shingle module 60. For instance, each shingle 30 in FIG. 3 extends beyond one of the lateral edges of underlying backsheet 70. In this arrangement, PV shingles 30 also conceal the edges of laterally adjacent backsheets.

Figure 4:
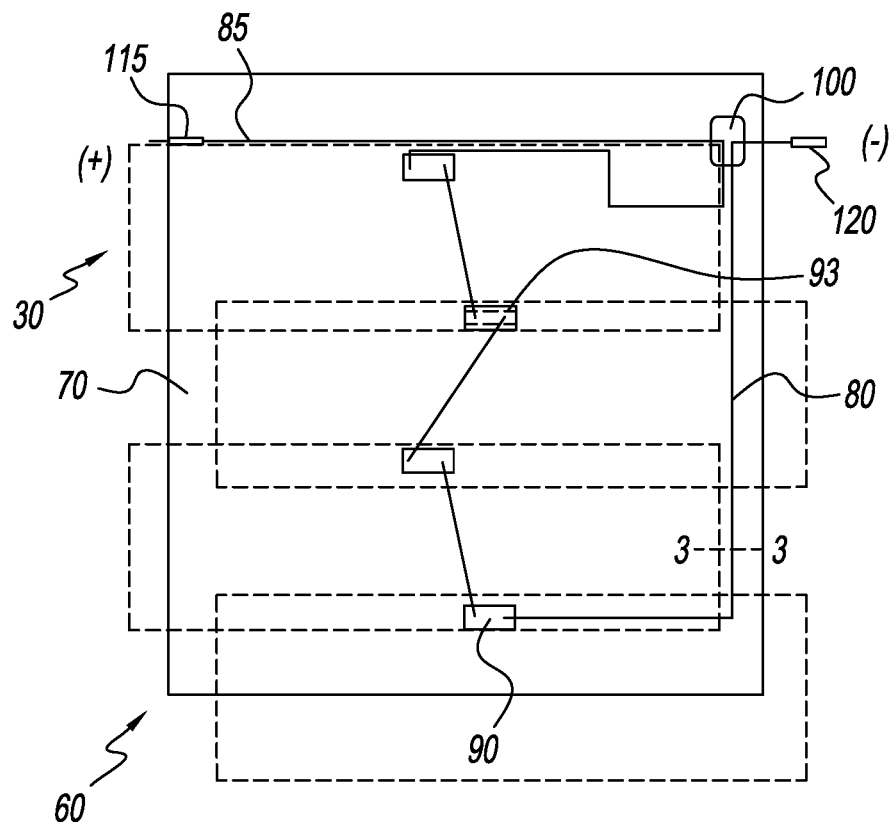
FIG. 4 is a front view of a backsheet of a photovoltaic module, depicting electrical connectors configured to electrically connect photovoltaic shingles attached to the backsheet.
Figure 5:
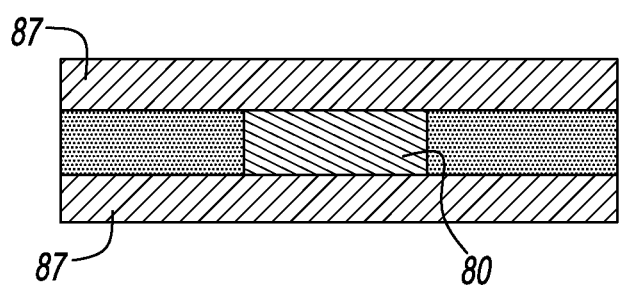
FIG. 5 is a partial cross-sectional view of a backsheet with embedded electrically conductive shingle connectors.

FIG. 4 depicts backsheet 70 with PV shingles 30 removed to show the electrical connection components of backsheet 70. Backsheet 70 includes electrically conductive shingle connectors 80 and electrical module connectors 85. Electrically conductive shingle connectors 80 are copper electrical ribbons or other conductive material that electrically connect PV shingles 30 to other PV shingles 30 in the same PV shingle module 60. In some embodiments, electrically conductive shingle connectors 80 are embedded or internal to backsheet 70 for protection, aesthetic appeal, and/or lower material costs relative to external cables. For example, backsheet 70 may include two polymer films 87 adhered one on top of the other, with electrically conductive shingle connectors 80 disposed between the two films. FIG. 5 depicts a cross-section of backsheet 70 in this embodiment.

Backsheet 70 includes backsheet openings 90 exposing portions of electrically conductive shingle connectors 80 such that electrically conductive shingle connectors 80 may contact positive terminal 47 and negative terminal 48 of PV shingles 30 through opening 55 of PV shingle 30. In some embodiments, the portions of the electrically conductive shingle connectors 80 exposed by each backsheet opening may terminate at end portions configured to align with the positive and negative terminals of each corresponding shingle. PV shingles 30 may be connected in series, in parallel, or in a combination of series and parallel. The backsheet openings 90 may be arranged in any desired pattern corresponding to a desired shingling pattern. For example, the backsheet openings may be laterally staggered to allow the shingles to be disposed on the backsheet in a laterally staggered pattern. Similarly, adjacent backsheet openings may be offset in any other manner, to allow the shingles to be disposed on the backsheet in a corresponding offset pattern.

PV shingle module 60 may include a junction box 100 electrically connected to the flexible PV shingles 30 of that module by electrically conductive shingle connectors 80. In some embodiments, each PV shingle module 60 includes a respective junction box 100; in other embodiments, multiple PV shingle modules share a junction box. Junction box 100 may be disposed on backsheet 70 or on PV shingles 30. Junction box 100 may include bypass diodes or switches 110 and may also include other electronic components performing functions typical for solar power module junction boxes, such as overvoltage protection devices and/or micro inverters. In other embodiments, bypass diodes or switches 110 are disposed on PV shingles 30. Junction box 100 may be a low-profile junction box, and may be concealed from view by a PV shingle 30.

Junction box 100 is connected to a module anode 115 and a module cathode 120 by electrical module connectors 85. Electrical module connectors 85 may be free wires or cables with multi-contact (MC) connectors (e.g. MC4 connectors) or any other electrical connector suitable for use in these applications. In some cases, module connectors 85 may be embedded within backsheet 70 in a manner similar to shingle connectors 80, with only portions of the module connectors exposed to facilitate the interconnection of adjacent modules. In other cases, module connectors may be attached to the backsheet in a different manner, such as not embedded in the backsheet, or attached only at discrete points on the backsheet. In some embodiments, each shingle includes one or more bypass diodes, which may replace junction box 100. For example, individual PV cells of each PV shingle 30 may be interconnected using bypass diodes. Electrically conductive shingle connectors 80 may then connect each PV shingle 30 with other PV shingles 30 of PV module 60 and these connectors may define module anode 115 and module cathode 120 at terminal ends of the shingle connectors used to interconnect the shingles of a module.

Electrical connection of PV shingles 30 to backsheet 70 may be accomplished by any suitable method, for instance using electrically conductive material 93 disposed between the exposed portions of shingle connectors 80 and the positive and negative terminals of each shingle. The electrically conductive material may, for example, include or consist of electrically conductive tape (e.g. Z-axis PSA-adhered tape), electrically conductive adhesive, solder, conventional welds, and/or laser welds. In some embodiments, PV shingles 30 are partially manufactured (e.g. without added protective layers) prior to attachment to backsheet 70. Backsheet 70 may be manufactured according to method 200, described below in relation to FIG. 12.

Positive terminals 47 and negative terminals 48 exposed by opening 55 in each shingle are then electrically connected to portions of electrically conductive shingle connectors 80 exposed through cut-outs or apertures 90 formed in the backsheet. Any top protective layers may then be added to the entire PV module 60, and the entire structure is laminated together, further mechanically attaching PV shingles 30 to backsheet 70. In other words, each opening 55 in the flexible substrate of one of shingles 30 is configured to be aligned with a respective one of the backsheet apertures 90 when the shingles are disposed on the backsheet, thereby electrically connecting the shingle connectors 80 of the backsheet to the positive and negative terminals 47, 48 of each shingle, and electrically connecting shingles 30 to each other, when the shingles are disposed on the front side of the backsheet.

Figure 6:
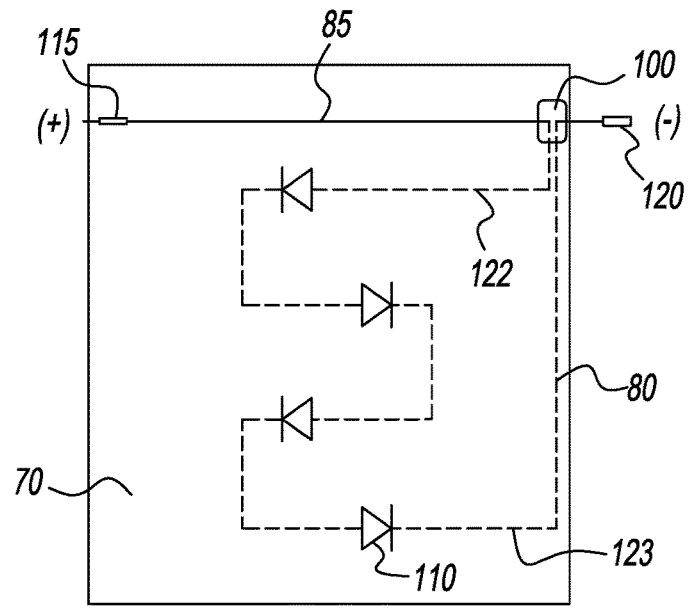
FIG. 6 is a schematic diagram depicting electrical connections in a photovoltaic module.

FIG. 6 is a schematic diagram of the electrical connections created by electrically conductive shingle connectors 80 and electrical module connectors 85 in an illustrative embodiment of PV shingle module 60. In this schematic, each PV shingle 30 is represented as a diode in an electrical circuit formed by the shingles and the connectors. The schematic depicts four PV shingles 30 (corresponding to the PV shingles 30 depicted in FIGS. 3-4) electrically connected in series by electrically conductive shingle connectors 80. The serially connected set of PV shingles 30 includes an anode end 122 and a cathode end 123. Anode end 122 is connected through junction box 100 to module anode 115, and cathode end 123 is connected through junction box 100 to module cathode 120. As described previously, in some cases, such as when bypass diodes are included with the PV cells, a junction box may not be necessary.

In the embodiment of FIG. 6, the connections between anode end 122 and junction box 100, as well as the connections between cathode end 123 and junction box 100, are formed by electrically conductive shingle connectors 80. On the other hand, the connections between junction box 100 and module anode 115, and the connections between junction box 100 and module cathode 120, are formed by electrical module connectors 85. Module anode 115 and module cathode 120 may be electrically connected to a module cathode and module anode of another PV shingle module 60, or to another system associated with the PV shingle modules, such as an inverter, or a combining system configured to combine the outputs of several PV shingle modules.

Figure 7:
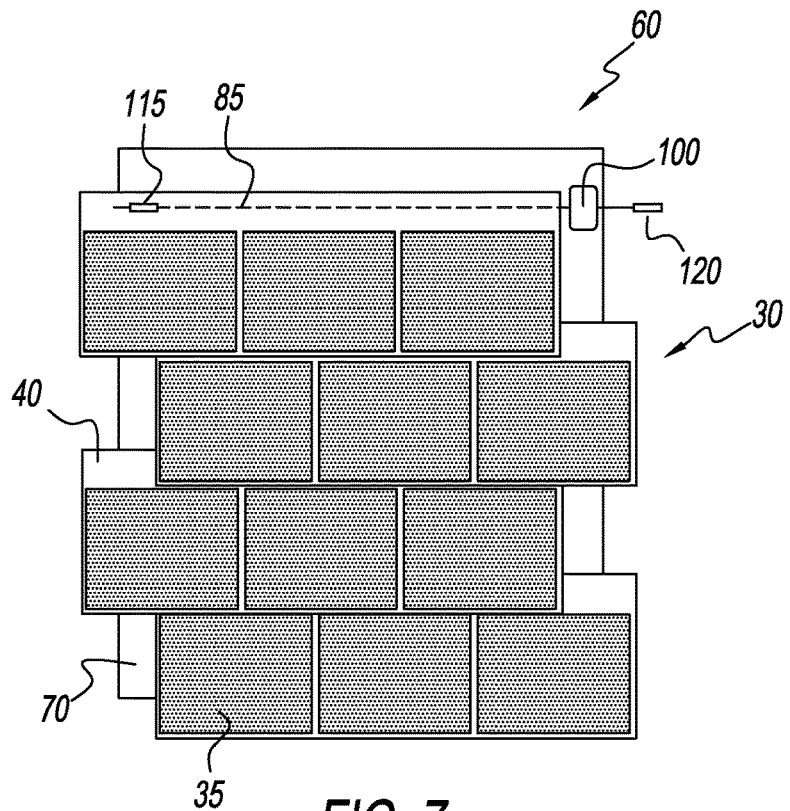
FIG. 7 is a front view of a photovoltaic module, depicting electrical connections configured to electrically connect the module to other modules and a junction box disposed in a first illustrative configuration.

FIG. 7 depicts an illustrative PV shingle module 60 with an illustrative layout of electrical module connectors 85 and junction box 100. In the embodiment depicted in FIG. 7, junction box 100 is disposed in an upper corner of backsheet 70, but other locations are possible, or the junction box may be omitted entirely in some situations. Electrical module connectors 85 include a first cable, or other suitable connector, passing underneath a PV shingle 30 to connect junction box 100 to module anode 115. In this embodiment, module anode 115 is disposed on backsheet 70 underneath PV shingle 30, and therefore both module anode 115 and the first cable of electrical module connectors 85 are concealed from view. Electrical module connectors 85 also include a second cable, or another suitable connector, connecting junction box 100 to module cathode 120. Junction box 100, the second cable, and module cathode 120 may be concealed underneath a PV shingle 30 or backsheet 70 of an adjacent PV shingle module 60. In that case, junction box 100, module anode 115 and module cathode 120, and all parts of electrical module connectors 85 are concealed from view and do not detract from the aesthetic appeal of the roof. PV shingles 30 may also protect components underneath them from damage. This includes but is not limited to connectors 85, junction box 100, anode 115 and cathode 120.

Although FIG. 7 depicts module connectors 85 disposed below the uppermost shingle 30 (between the shingle and the backsheet), another configuration is possible wherein connectors 85 are disposed above one or more of the PV shingles 30 of module 60. For example, the portion of connectors 85 shown below the top shingle 30 in FIG. 7 (in dashed lines) could be disposed above the top shingle instead. In this case, the portion on top of the uppermost shingle 30 would be disposed on attachment area 75 of the shingle, and this portion of the module connectors would therefore be sandwiched between the uppermost shingle in FIG. 7 and the lowest shingle of a module placed directly above module 60. Other portions of connectors 85, which extend to the right of the uppermost shingle in FIG. 7, would still be covered by a shingle of a module placed directly to the right of module 60. Accordingly, module connectors 85 can be entirely covered and protected from the elements, even if the connectors are moved to the top side of the module of FIG. 7.

Figure 8:
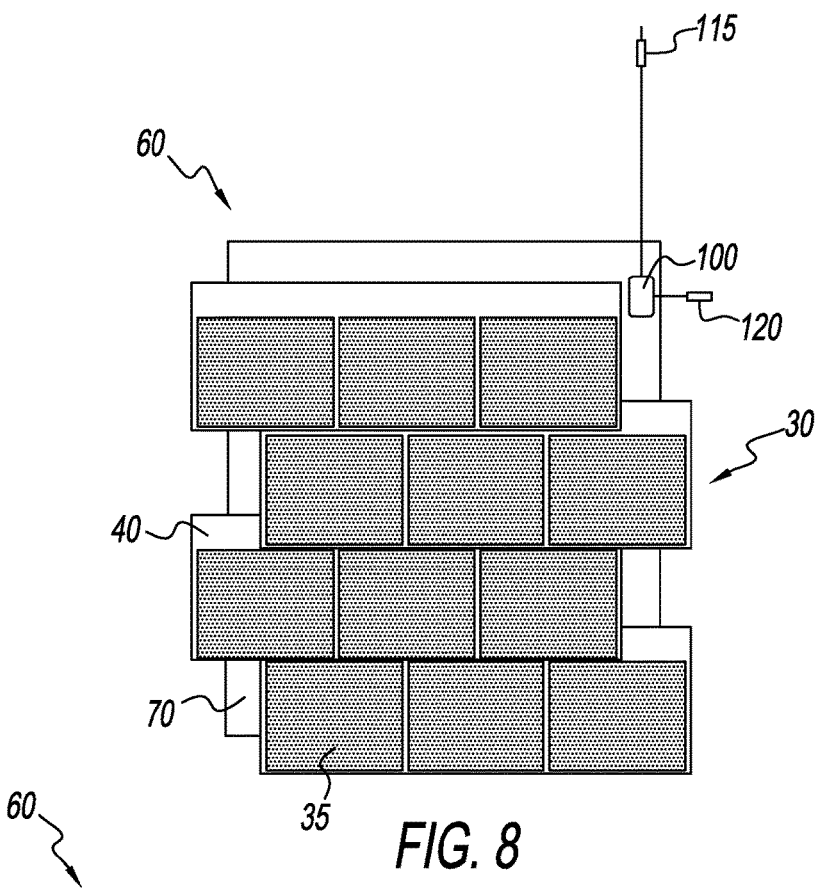
FIG. 8 is a front view of a photovoltaic module with electrical module connections and a junction box disposed in a second illustrative configuration.

FIG. 8 depicts an embodiment of a module in which the module connectors extend in a different direction relative to the embodiment of FIG. 7. Specifically, in the embodiment of FIG. 7, the module connectors are both oriented substantially parallel to a long edge of PV shingles 30, whereas in the embodiment of FIG. 8, one of the module connectors is oriented substantially parallel to a short edge of PV shingles 30, while the other remains oriented substantially parallel to the long edge of the shingles. Different orientations or positions for junction box 100 and electrical module connectors 85 may be chosen based on the position of PV shingles 30 on backsheet 70, the position of attachment area 75 on PV shingles 30, the means of attaching PV shingles 30 to backsheet 70, and/or other factors.

Figure 9:
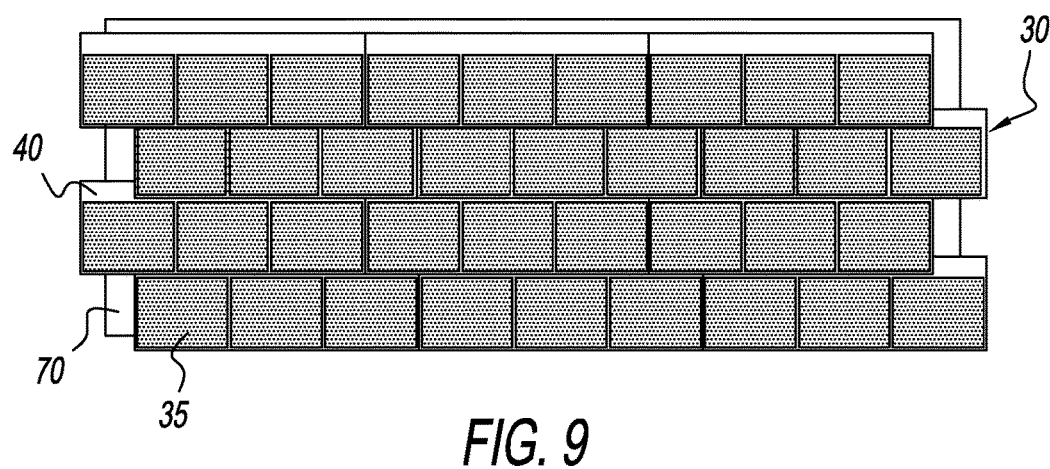
FIG. 9 is a front view of an illustrative photovoltaic module including rows of several photovoltaic shingles.

FIG. 9 depicts another illustrative embodiment of PV shingle module 60. In this embodiment, flexible PV shingles 30 are disposed on backsheet 70 in rows; each row includes several PV shingles, and backsheet 70 includes several rows. PV shingles 30 within a row overlap with the shingles in adjacent rows, but do not overlap with adjacent shingles within the same row. A large variety of such configurations is possible, depending on the size and shape of the surface to be covered by PV shingles.

B. Illustrative Photovoltaic Array

Figure 10:
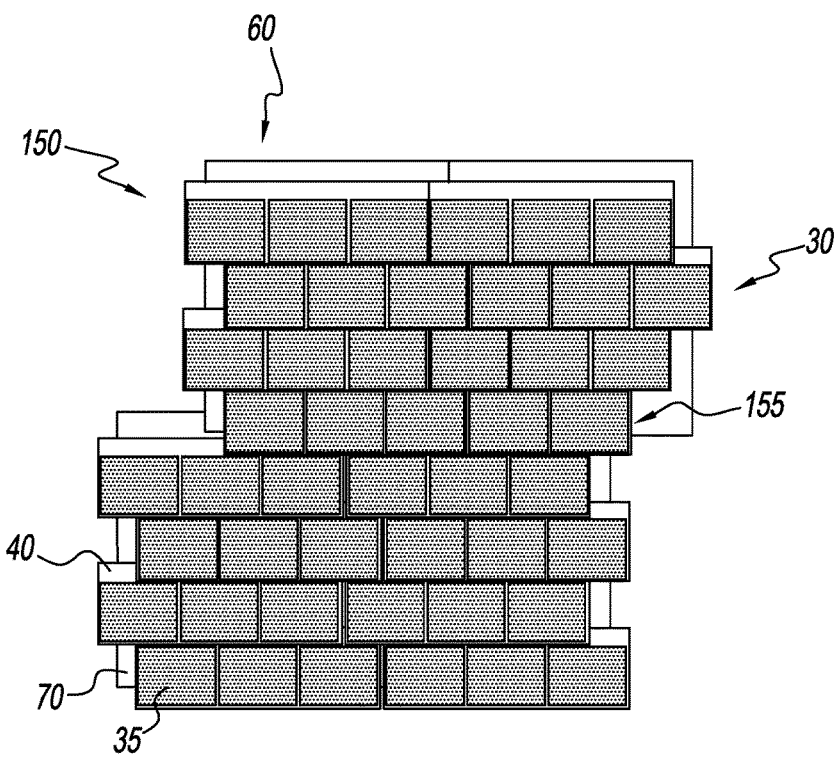
FIG. 10 is a front view of an illustrative array of photovoltaic modules.
Figure 11:
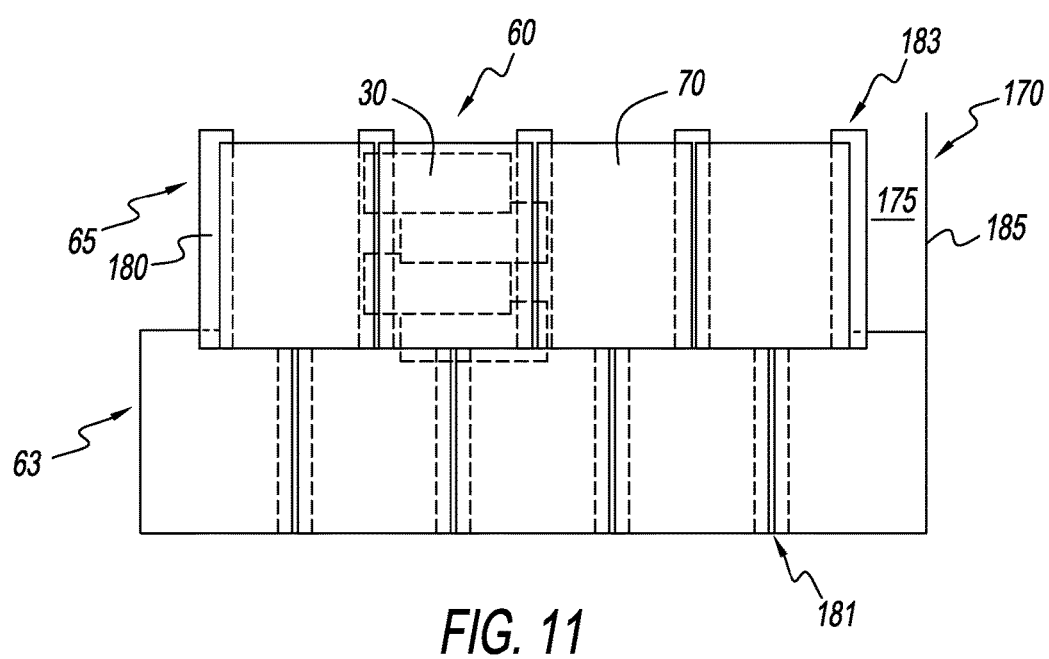
FIG. 11 is a schematic diagram depicting a roof including photovoltaic modules.

As shown in FIGS. 10-11, this section describes an illustrative photovoltaic array. This photovoltaic array is an example of an assembly of photovoltaic modules including pluralities of photovoltaic shingles disposed on and electrically interconnected by integrated backsheets.

FIG. 10 depicts two identical, illustrative PV shingle modules 60 arranged in a multi-module array 150. Array 150 may form part of a roof of a residential building or other structure. Array 150 would typically include a plurality of additional identical modules 60, and/or similar modules which may be modified at edge portions of the roof (e.g., by trimming the shingles without interrupting the corresponding electrical circuit, or by providing either PV or non-PV shingles to fit along the edge portions). PV shingle modules 60 in array 150 are disposed such that the edges of backsheet 70 on each module abuts or overlaps with the edges of backsheets 70 of adjacent modules. Backsheets 70 may be attached to overlapping areas of adjacent backsheets 70, by any suitable method such as nails, adhesive, or welds, among others.

PV shingle modules 60 are arranged such that PV shingles 30 of one of modules 60 abut the shingles of adjacent modules. In other examples, the shingles of adjacent modules may laterally overlap to some desired degree. Although the embodiment depicted in FIG. 10 includes four PV shingle modules 60, array 150 may include any number of PV shingle modules. Array 150 may include gap shingles (not shown) shaped to fill in gaps between PV shingles 30, or to fill spaces at the edges of array 150 where PV shingles 30 do not fully cover backsheet 70. In some embodiments, gap shingles may be identical to or similar to PV shingles 30; however, in other cases the gap shingles may not be functional (i.e., they may not include functioning PV cells 35, and they may not be electrically connected to any other component of array 150). In some cases, gap shingles 155 may be standard roofing shingles or other non-photovoltaic material. Because there are many different places on backsheets 70 where junction boxes 100 and electrical module connectors 85 may be located, PV modules 60 can be arranged in many different configurations to form an array 150.

Array 150 may form at least part of a roof of a residential building or other structure, with backsheet 70 serving as the roof underlayment and PV shingles 30 serving as roofing shingles. Because PV shingle module 60 is integrated into a roof rather than mounted on the roof, it may be regarded as a building-integrated photovoltaic (BIPV) system.

FIG. 11 depicts an illustrative roof 170 including a plurality of PV shingle modules 60 (for clarity, only one module is shown in its entirety). In this embodiment, roof 170 includes decking or sheathing 175, a plurality of photovoltaic shingle modules 60, and first and second rows of interleaves, vapor barrier sheets, weather barrier sheets, or roofing membranes 180. Each row of interleaves or roofing membranes may be disposed on a front surface of decking 175 and between decking 175 and photovoltaic shingle modules 60. One exemplary PV module 60 including a plurality of photovoltaic shingles 30 is shown in FIG. 11. Additional PV modules 60 would generally also include a plurality of photovoltaic shingles disposed on each backsheet 70, but for simplicity, FIG. 11 omits these shingles. Each PV shingle 30 also includes a plurality of PV cells, (not shown in FIG. 11) as described above and depicted in FIG. 1.

Decking 175 is typically a protective layer of panels of plywood, oriented strand board, or other suitable material applied to a portion of roof 170, such as rafters or a truss. Roofing membranes 180 are attached to decking 175. Roofing membranes 180 may be vapor barrier sheets made of plastic, foil, or any other material suitable to prevent water from penetrating into decking 175. In the embodiment depicted in FIG. 11, roofing membranes 180 are shaped in strips with a length slightly greater than the length of a PV module 60. The first row 181 of roofing membranes 180 (the bottom row in FIG. 11) is attached to decking 175 adjacent a perimeter 185 of decking 175.

Roofing membranes 180 are disposed substantially parallel to each other on decking 175. The distance between roofing membranes 180 is chosen such that, when PV modules 60 are attached to decking 175, edges of the backsheets of adjacent PV modules meet on top of the roofing membranes. This results in virtually every portion of decking 175 being covered by a roofing membrane and/or one of the PV module backsheets, and reduces the possibility of moisture penetrating to (or through) the decking. Roofing membranes 180 may be attached to decking 175 with adhesive, tape, nails, staples, or any other suitable mechanism. Roofing membranes 180 may be sealed with a sealant applied to the top and/or edges of each membrane.

As FIG. 11 depicts, a first row 63 of PV modules 60 is attached to decking 175 adjacent the perimeter of the decking. PV modules 60 are disposed in a row, with edges of backsheets 70 of adjacent PV modules meeting on top of roofing membranes 180. In some embodiments (as depicted in FIG. 11), there is a gap between backsheets 70 of adjacent PV modules 60. This gap may be covered by the PV shingles 30 of PV modules 60. In other embodiments, backsheets 70 of adjacent PV modules 60 are disposed edge-to-edge with substantially no gap between the edges. The first row of PV modules 60 may be disposed at or adjacent perimeter 185. Backsheets 70 may be attached to decking 175 and/or to roofing membranes 180 by nails, adhesives, and/or another fastening mechanism.

A second row 183 of roofing membranes 180 is further attached to decking 175, above first row 181 in FIG. 11. Roofing membranes 180 in second row 183 are disposed such that end portions of the roofing membranes overlap slightly with PV modules 60 of the first row. Roofing membranes 180 of second row 183 are substantially parallel to, but offset from, the roofing membranes of first row 181; i.e., roofing membranes of the first row do not necessarily lie along a same line as roofing membranes of the second row. The offset may help to prevent the formation of channels of moisture running down the roof between PV modules 60.

Still with regard to FIG. 11, a second row 65 of PV modules 60 is further attached to decking 175 adjacent the first row of modules. In the embodiment of FIG. 11, there is a narrow gap between backsheets 70 of adjacent PV modules 60 in the second row; in other embodiments, there is no gap and edges of backsheet 70 are in direct contact with edges of adjacent backsheets 70 (i.e., the edges abut each other). PV shingles 30 and/or backsheets 70 of PV modules 60 of the second row may overlap with the PV modules of the first row.

Additional rows of roofing membranes 180 and PV modules 60 may be included in the roof. In some embodiments, roofing membranes 180 of a third row are aligned with roofing membranes of the first row 181 (i.e., these roofing membranes lie along a same line), and roofing membranes of a fourth row are aligned with roofing membranes of the second row 183; i.e., the roofing membranes of alternating rows are aligned with each other. The offset between roofing membranes 180 of adjacent rows may be approximately equal to half of the width of backsheet 70. In this case, PV modules 60 are disposed in a pattern resembling a racking or vertical racking pattern of traditional roofing shingles. In some embodiments, roofing membranes 180 of alternating rows are not all aligned with each other, and roofing membranes of adjacent rows may be offset from each other by a distance smaller than half of the width of backsheet 70. These embodiments may resemble a step or stair-step shingle pattern of traditional roofing shingles. By selecting appropriate positions for the roofing membranes and the backsheets of the PV modules, any desired shingle pattern can be realized.

Rows of PV modules 60 as described above may not fill all the space available on decking 175. Space on decking 175 or other parts of the roof structure that are not covered by rows of PV modules 60 may be covered by individual PV modules, which may be sized, shaped, or otherwise configured to fill a particular space. Space on decking 175 or other parts of the roof structure not covered by PV modules 60 may also be filled by PV shingles 30, traditional roofing shingles, or any other material suitable for protecting the roof from the environment without compromising the aesthetic appeal of the roof. In some cases, PV modules 60 are installed in a roof that already includes standard roofing shingles. For example, PV modules 60 can be retrofitted into an existing roof, by replacing some or all of the standard shingles with PV shingle modules.

In some embodiments, discrete roofing membranes 180 are omitted and a monolithic roofing membrane or vapor barrier sheet is instead disposed behind PV modules 60.

C. First Illustrative Method

Figure 12:
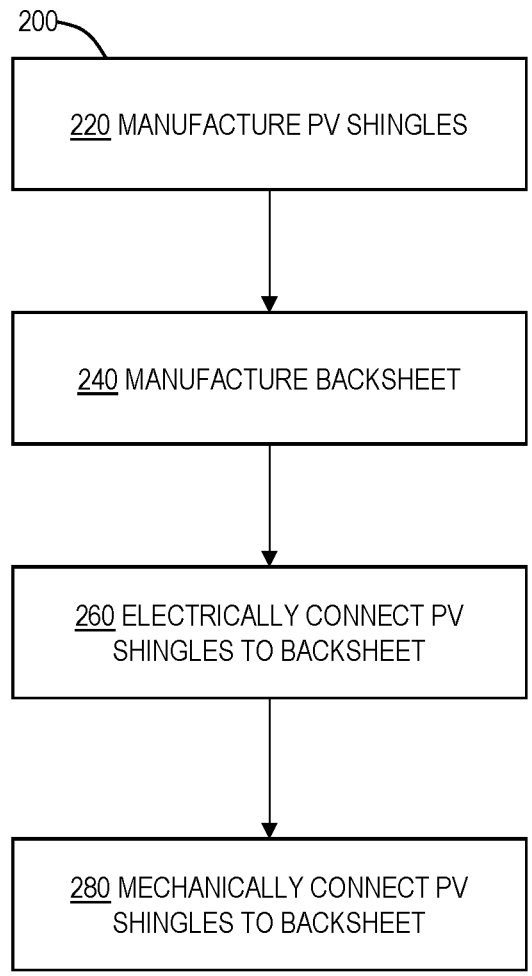
FIG. 12 is a flow diagram depicting steps in an illustrative method of manufacturing a photovoltaic module.

This section describes steps of an illustrative method for manufacturing a photovoltaic shingle module according to aspects of the current disclosure; see FIG. 12. Aspects or components of the illustrative photovoltaic module described above may be utilized in the method steps described below. Where appropriate, reference may be made to components and systems that may be used in carrying out each step. These references are for illustration, and are not intended to limit the possible ways of carrying out any particular step of the method.

FIG. 12 is a flow diagram illustrating steps performed in an illustrative method 200 of manufacturing a PV module 60, and may not recite the complete process or all steps of the method. Although various steps of method 200 are described below and depicted in FIG. 12, the steps need not necessarily all be performed, and in some cases may be performed simultaneously or in a different order than the order shown.

In method 200, backsheet 70 and flexible PV shingles 30 are manufactured independently and then connected to form PV module 60. Accordingly, backsheet 70 and PV shingles 30 can be optimized independently for best photovoltaic and electrical performance and lowest total material cost. Additionally, PV shingle 30 can be configured to resemble standard roofing shingles (e.g. in size, shape, texture, and/or color) without concern for the weatherability of PV module 60, because backsheet 70 provides weatherability.

At step 220, method 200 includes manufacturing one or more flexible PV shingles, such as PV shingles 30 described previously. The PV shingles each include one or more interconnected PV cells, such as previously described cells 35. In one embodiment, the PV cells within a shingle are electrically connected to each other by integrated cell interconnect structures or methods. In such an embodiment, each cell has sections of photoactive material removed to form one or more electrically isolated interconnection areas. A pattern of electrical conductors extends from the top surface of one cell to the interconnection areas of an adjacent cell, where due to the removal of photoactive layers, the conductors can make electrical contact with the bottom electrode of the adjacent cell, thereby connecting the adjacent cells in electrical series. Step 220 may include creating opening, such as opening 55 discussed above, in each PV shingle to facilitate electrical connection to a backsheet. Step 220 also may include applying top protective layers to a top surface of each PV shingle and/or laminating the shingle.

At step 240, method 200 includes manufacturing a backsheet, such as backsheet 70 described previously. In some embodiments, a junction box may be attached to or integral to the backsheet. In some embodiments, the junction box is attached to or integral to a PV shingle. In some embodiments, PV cells in the shingles may include bypass diodes, in which case a junction box may not be used. In some cases, the backsheet may be formed by adhering or laminating two polymer sheets or films together with electrically conductive shingle connectors between them (e.g., see FIG. 5). Electrically conductive shingle connectors may be formed by placing or depositing conductive ribbons, wires, or traces on between polymer sheets before adhering or laminating the sheets together. One of the polymer sheets may include backsheet openings prior to assembly of the backsheet. In some embodiments, backsheet openings are cut or etched into the polymer sheets after the sheets are adhered or laminated together, or during the lamination or adhesion process. In some embodiments, electrical module connectors are also included between the polymer sheets.

At step 260, method 200 includes electrically connecting the PV shingles to the backsheet. Step 260 may include electrically connecting positive and negative terminals of the PV shingles to the electrically conductive shingle connectors of the backsheet. The electrical connectors between the PV shingles and the backsheet may be created by attaching the positive and negative terminals to the electrically conductive shingle connectors directly or through connecting tabs, wires, or other conducting mechanisms. Electrical connection between the PV shingles and the backsheet may be facilitated by the use of conductive tape, conductive adhesive, soldering, welding, and/or any other suitable electrically conductive material.

At step 280, method 200 includes mechanically connecting the PV shingles to the backsheet. The PV shingles may be connected to the backsheet by lamination, adhesive, or any other suitable mechanism. In some embodiments, an attachment area (such as attachment area 75) of each PV shingle is connected to the backsheet and other portions of the PV shingles are not directly connected to the backsheet.

In some embodiments, the backsheet is attached to a roof or partial roof prior to electrically and/or mechanically connecting the PV shingles to the backsheet. In these embodiments, the PV module is constructed at least partially while it is already integrated, or being integrated, into the roof.

Some elements of PV modules used in conjunction with method 200, such as electrically conductive shingle connectors, electrical module connectors, a junction box, bypass diodes, PV cell connection conductive traces, or vapor barriers, can be included on either the PV shingle or the backsheet.

D. Second Illustrative Method

Figure 13:
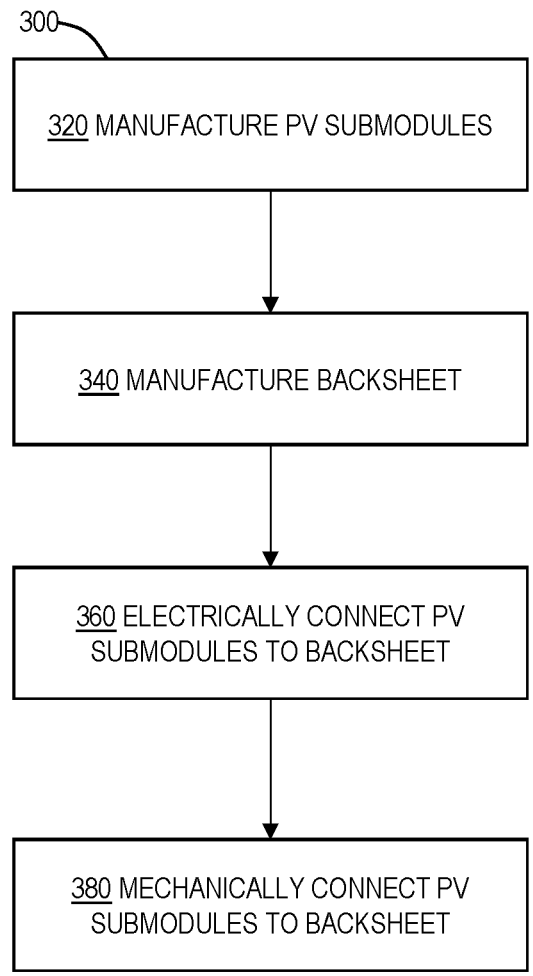
FIG. 13 is a flow diagram illustrating steps performed in another illustrative method of manufacturing a PV module.

This section describes steps of an illustrative method for manufacturing a photovoltaic shingle module according to aspects of the current disclosure; see FIG. 13. Aspects of the illustrative photovoltaic module described above may be utilized in the method steps described below. Where appropriate, reference may be made to components and systems that may be used in carrying out each step. These references are for illustration, and are not intended to limit the possible ways of carrying out any particular step of the method.

FIG. 13 is a flow diagram illustrating steps performed in an illustrative method 300 of manufacturing a PV module, and may not recite the complete process or all steps of the method. Although various steps of method 300 are described below and depicted in FIG. 13, the steps need not necessarily all be performed, and in some cases may be performed simultaneously or in a different order than the order shown. Method 300 is substantially similar in some respects to method 200 (see FIG. 12 and related description above), however in method 300, PV shingles are not manufactured entirely independently of a backsheet to which the shingles will be attached.

At step 320, method 300 includes manufacturing one or more photovoltaic submodules. The photovoltaic submodules may be substantially identical to PV shingles 30 described previously, except that protective layers are not applied and the submodule is not sealed or laminated during step 320.

At step 340, a backsheet is manufactured. Step 340 is substantially identical to step 240.

At step 360, method 300 includes electrically connecting the PV submodules to the backsheet. Positive and negative terminals of the PV submodules are soldered, welded, or otherwise electrically connected to electrically conductive shingle connectors of the backsheet.

At step 380, method 300 includes mechanically connecting the PV submodules to the backsheet. Unitary top protective layers are applied to the entire PV module using adhesive. The PV module is then laminated, sealing the module and mechanically attaching completed the PV shingles to the backsheet. This method may help to protect the electrical connections between the PV shingles and the backsheet from water incursion and damage.

E. Third Illustrative Method

Figure 14:
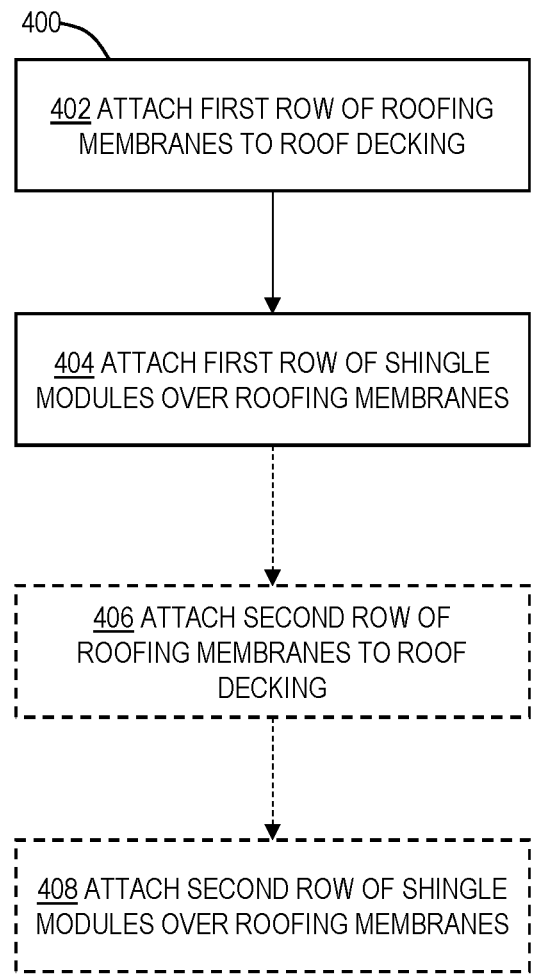
FIG. 14 is a flow diagram illustrating steps performed in yet another illustrative method of manufacturing a PV module.

This section describes steps of an illustrative method for installing a photovoltaic shingle array on a rooftop according to aspects of the current disclosure; see FIG. 14. Aspects of the illustrative photovoltaic module and the illustrative photovoltaic array described above may be utilized in the method steps described below. Where appropriate, reference may be made to components and systems that may be used in carrying out each step. These references are for illustration, and are not intended to limit the possible ways of carrying out any particular step of the method.

FIG. 14 is a flow diagram illustrating steps performed in an illustrative method 300 of manufacturing a PV module, and may not recite the complete process or all steps of the method. Although various steps of method 400 are described below and depicted in FIG. 14, the steps need not necessarily all be performed, and in some cases may be performed simultaneously or in a different order than the order shown. In method 400, a first row of roofing membranes, such as membranes 180 described previously, is attached to a roof decking. A first row of PV shingle modules is then attached to the first row of roofing membranes. In some embodiments, a second row of roofing membranes is attached to the roof decking, followed by a second row of PV shingle modules. This method can be repeated any number of times until a roof including a photovoltaic array is fully covered with PV shingle modules.

At step 402, method 400 includes attaching a first row of roofing membranes to the roof decking. The first row of roofing membranes may be attached to the roof using adhesive, tape, nails, staples or any other suitable attachment method. The distance between roofing membranes is chosen such that, when PV modules are attached to the roof decking, edges of adjacent PV modules meet on top of the roofing membranes.

At step 404, method 400 includes attaching a first row of PV shingle modules to the first row of roofing membranes. Attaching the PV shingle modules to the roofing membranes may include, for example, nailing, stapling, or adhering the backsheet of each shingle module to two adjacent roofing membranes.

At step 406, method 400 optionally includes attaching a second row of roofing membranes to the decking. Step 406 may be substantially identical to step 402. At step 408, method 400 optionally incudes attaching a second row of PV shingle modules to the second row of roofing membranes. Step 408 may be substantially identical to step 404. Similarly, additional steps may be performed to attach more rows of roofing membranes and PV shingle modules to the roof decking. In some cases, as has been described previously, a monolithic membrane or vapor barrier layer may be used alternatively or in addition to discrete roofing membranes in some or all of the rows.

F. Illustrative Combinations and Additional Examples

This section describes additional aspects and features of shingled photovoltaic modules, presented without limitation as a series of paragraphs, some or all of which may be alphanumerically designated for clarity and efficiency. Each of these paragraphs can be combined with one or more other paragraphs, and/or with disclosure from elsewhere in this application, including the materials incorporated by reference in the Cross-References (if any), in any suitable manner. Some of the paragraphs below expressly refer to and further limit other paragraphs, providing without limitation examples of some of the suitable combinations.

A. A photovoltaic module comprising:
a weatherable backsheet including:
a plurality of electrically conductive shingle connectors embedded within the backsheet; and
a plurality of backsheet openings, each opening exposing portions of two of the electrically conductive shingle connectors on a front side of the backsheet; and
a plurality of flexible photovoltaic shingles configured to be disposed on the front side of the backsheet, each shingle including:
a flexible substrate having an opening in a back side;
a plurality of photovoltaic cells disposed on a front side of the substrate; and
a plurality of conductive traces disposed between the front side of the substrate and the photovoltaic cells, the traces defining a conductive path electrically interconnecting the photovoltaic cells, and further defining a positive terminal and a negative terminal accessible through the opening in the back side of the flexible substrate;
wherein each opening in the back side of the flexible substrate of one of the shingles is configured to be aligned with a respective one of the backsheet openings, thereby electrically connecting the shingle connectors to the positive and negative terminals of each shingle and electrically connecting the shingles to each other, when the shingles are disposed on the front side of the backsheet.

A1. The photovoltaic module of paragraph A, wherein the backsheet includes two polymer films adhered together, and the electrically conductive shingle connectors are disposed between the two films.

A2. The photovoltaic module of paragraph A, wherein adjacent backsheet openings are laterally staggered to allow the shingles to be disposed on the backsheet in a laterally staggered pattern.

A3. The photovoltaic module of paragraph A, wherein the electrically conductive shingle connectors define a module anode and a module cathode at terminal ends of the shingle connectors, and further comprising junction box connected to the module anode and the module cathode.

A4. The photovoltaic module of paragraph A, wherein electrically conductive tape is disposed between the exposed portions of the shingle connectors and the positive and negative terminals of each shingle.

A5. The photovoltaic module of paragraph A, wherein each shingle includes an attachment area extending along an upper edge of the shingle and each shingle is configured only to be attached to the backsheet at its respective attachment area, thereby allowing an unattached portion of each shingle to be lifted up away from the backsheet.

A6. The photovoltaic module of paragraph A wherein the electrically conductive shingle connectors exposed by each backsheet opening terminate at end portions configured to align with the positive and negative terminals of each corresponding shingle.

B. A photovoltaic module comprising:
 a plurality of flexible photovoltaic shingles, each including:
  a flexible substrate having an opening in one side;
  a plurality of photovoltaic cells disposed on a side of the substrate opposite the opening; and
  a plurality of conductive traces disposed between the substrate and the photovoltaic cells, the traces electrically interconnecting the photovoltaic cells, and defining a positive terminal and a negative terminal associated with the interconnected cells and accessible through the opening in the substrate; and
 a flexible backsheet including:
  a plurality of electrically conductive shingle connectors attached to the backsheet; and
  a plurality of backsheet apertures, each aperture exposing portions of two of the shingle connectors on one side of the backsheet;
 wherein each opening in the flexible substrate of one of the shingles is configured to be aligned with a respective one of the backsheet apertures when the shingles are disposed on the backsheet, thereby electrically connecting the shingle connectors of the backsheet to the positive and negative terminals of each shingle and electrically connecting the shingles to each other.

B1. The photovoltaic module of paragraph B, wherein the backsheet is a multi-layer backsheet and the electrically conductive shingle connectors are disposed between layers of the backsheet.

B2. The photovoltaic module of paragraph B1, wherein the backsheet includes two polymer films adhered together, and the electrically conductive shingle connectors are disposed between the two films.

B3. The photovoltaic module of paragraph B, wherein adjacent backsheet openings are laterally staggered to allow the shingles to be disposed on the backsheet in a laterally staggered pattern.

B4. The photovoltaic module of paragraph B, wherein electrically conductive tape or electrically conductive adhesive is disposed between the exposed portions of the shingle connectors and the positive and negative terminals of each shingle.

B5. The photovoltaic module of paragraph B, wherein each shingle includes an attachment area extending along an upper edge of the shingle and each shingle is configured only to be attached to the backsheet at its respective attachment area, thereby allowing an unattached portion of each shingle to be lifted up away from the backsheet.

B6. The photovoltaic module of paragraph B, wherein the electrically conductive shingle connectors exposed by each backsheet opening terminate at end portions configured to align with the positive and negative terminals of each corresponding shingle.

C. A photovoltaic module comprising:
 a plurality of flexible photovoltaic shingles, each including:
  a flexible substrate;
  a plurality of photovoltaic cells disposed on one side of the substrate;
  a plurality of conductive traces disposed between the substrate and the photovoltaic cells, the traces electrically interconnecting the photovoltaic cells and defining a positive terminal and a negative terminal associated with the interconnected cells; and
  an opening formed in the flexible substrate on a side opposite the photovoltaic cells, the opening providing access to the positive and negative terminals; and
 a multi-layer flexible backsheet including:
  a plurality of electrically conductive shingle connectors disposed between layers of the backsheet; and
  a plurality of backsheet apertures, each aperture exposing portions of two of the shingle connectors on one side of the backsheet;
 wherein each opening in the flexible substrate of one of the shingles is configured to be aligned with a respective one of the backsheet apertures when the shingles are disposed on the backsheet, thereby electrically connecting the shingles to each other.

C1. The photovoltaic module of paragraph C, wherein the backsheet includes two polymer films adhered together, and the electrically conductive shingle connectors are disposed between the two films.

C2. The photovoltaic module of paragraph C, wherein adjacent backsheet openings are offset to allow the shingles to be disposed on the backsheet in an offset pattern.

C3. The photovoltaic module of paragraph C, further comprising electrically conductive tape or electrically conductive adhesive disposed between the exposed portions of the shingle connectors and the positive and negative terminals of each shingle.

C4. The photovoltaic module of paragraph C, wherein each shingle includes an attachment area extending along an upper edge of the shingle and each shingle is configured only to be attached to the backsheet at its respective attachment area, thereby allowing an unattached portion of each shingle to be lifted up away from the backsheet.

C5. The photovoltaic module of paragraph C, wherein the electrically conductive shingle connectors exposed by each backsheet opening terminate at end portions configured to align with the positive and negative terminals of each corresponding shingle.

Advantages, Features, and Benefits

The different embodiments and examples of rooftop PV shingle modules with flexible shingles described herein provide several advantages over known solutions for including PV modules on rooftops. For example, glass-based crystalline silicon (c-Si) solar PV shingles are available, but have only a limited market share due to aesthetic issues and high production and installation costs. Glass PV shingles cannot easily mimic the appearance of asphalt shingles due to their rigidity and fragility. Furthermore, standard roof shingles are small relative to industry-standard solar modules. A standard 3-tab asphalt roof shingle size is 90 cm×30 cm (0.27 m²), whereas a typical c-Si solar module is 165 cm×100 cm (1.65 m²). Glass PV shingles that mimic the dimensions of asphalt shingles cost significantly more (per Watt of power produced) than typical c-Si PV modules due to the high costs of additional electrical connectors/cables and junction boxes, and the incremental cost of fabricating and installing many small components.

Flexible PV shingles are also significantly lighter than glass PV shingles, so flexible PV shingle modules induce significantly less stress on the roof. Using glass PV shingle modules may require structural reinforcement of the roof or other parts of the building, and using flexible PV shingle modules in accordance with aspects of the present teachings may eliminate the need for structural reinforcement. Due to their weight, glass PV shingles typically cannot be attached to a roof by adhesives. They may instead be attached by nails or other mechanisms that penetrate the shingle and roof and thus compromise weatherability or electrical and photovoltaic function. Flexible PV shingles are also less likely than glass PV shingles to sustain damage when walked on, e.g. during installation or building maintenance activities.

Some flexible solar modules are also available for residential roofing applications, but existing flexible modules lack an aesthetically acceptable shingle appearance, which poses a major obstacle to their use in residential buildings. They also do not offer an opportunity to simultaneously serve as an effective weatherable roofing element.

A rooftop PV shingle module including a plurality of flexible photovoltaic shingle submodules disposed on a weatherable backsheet may be easily and inexpensively manufactured, as the photovoltaic shingles may be manufactured independently of the backsheet. Electrical and mechanical connection of the shingles and backsheet may be performed in a factory manufacturing setting, as well as at an installation site.

Incorporating many flexible PV shingles on a monolithic, weatherable roofing backsheet, as in the embodiments depicted in previous sections, enables lower installation costs and greater produced power per component than modules with one shingle per backsheet. Using many PV shingles on a single backsheet requires a relatively simple installation involving nailing or adhering a single large product (rather than many small products) directly to the roof, without the risk of nailing through the photovoltaic components. It reduces the number of roof penetrations (e.g. from nails) required to install each PV shingle. In some cases, a single penetration or no penetration to the roof is required. Additionally, using a single junction box for multiple PV shingles is cost-effective.

Additionally, a PV shingle module according to the present disclosure is a building-integrated PV (BIPV) system. Costs associated with purchasing and installing PV shingle module and/or the roof including PV shingle module 60 may qualify for BIPV-related incentive programs such as United States federal tax credits.

No known system or device can perform these functions. However, not all embodiments and examples described herein provide the same advantages or the same degree of advantage.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. It is noted that various combinations and subcombinations of components have been described. Any of the components described or shown may be combined with any other components described or shown to create additional embodiments. In addition, explicit reference is hereby made to all inventions shown in the drawings.

CONCLUSION

The disclosure set forth above may encompass multiple distinct examples with independent utility. Although each of these has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only. The subject matter of the disclosure includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

What is claimed is:

1. A photovoltaic module comprising:
   a weatherable backsheet including:
     a plurality of electrically conductive shingle connectors embedded within the backsheet; and
     a plurality of backsheet openings, each opening exposing portions of two of the electrically conductive shingle connectors on a front side of the backsheet; and
   a plurality of flexible photovoltaic shingles configured to be disposed on the front side of the backsheet, each shingle including:
     a flexible substrate having an opening in a back side;
     a plurality of photovoltaic cells disposed on a front side of the substrate; and
     a plurality of conductive traces disposed between the front side of the substrate and the photovoltaic cells, the traces defining a conductive path electrically interconnecting the photovoltaic cells, and further defining a positive terminal and a negative terminal accessible through the opening in the back side of the flexible substrate;
   wherein each opening in the back side of the flexible substrate of one of the shingles is configured to be aligned with a respective one of the backsheet openings, thereby electrically connecting the shingle connectors to the positive and negative terminals of each shingle and electrically connecting the shingles to each other, when the shingles are disposed on the front side of the backsheet.

2. The photovoltaic module of claim 1, wherein the backsheet includes two polymer films adhered together, and the electrically conductive shingle connectors are disposed between the two films.

3. The photovoltaic module of claim 1, wherein adjacent backsheet openings are laterally staggered to allow the shingles to be disposed on the backsheet in a laterally staggered pattern.

4. The photovoltaic module of claim 1, wherein the electrically conductive shingle connectors define a module anode and a module cathode at terminal ends of the shingle connectors, and further comprising a junction box connected to the module anode and the module cathode.

5. The photovoltaic module of claim 1, wherein an electrically conductive material is disposed between the exposed portions of the shingle connectors and the positive and negative terminals of each shingle.

6. The photovoltaic module of claim 1, wherein each shingle includes an attachment area extending along an upper edge of the shingle and each shingle is configured only to be attached to the backsheet at its respective attachment area, thereby allowing an unattached portion of each shingle to be lifted up away from the backsheet.

7. The photovoltaic module of claim 1 wherein the electrically conductive shingle connectors exposed by each backsheet opening terminate at end portions configured to align with the positive and negative terminals of each corresponding shingle.

8. A photovoltaic module comprising:
a plurality of flexible photovoltaic shingles, each including:
a flexible substrate having an opening in one side;
a plurality of photovoltaic cells disposed on a side of the substrate opposite the opening; and
a plurality of conductive traces disposed between the substrate and the photovoltaic cells, the traces electrically interconnecting the photovoltaic cells, and defining a positive terminal and a negative terminal associated with the interconnected cells and accessible through the opening in the substrate; and
a flexible backsheet including:
a plurality of electrically conductive shingle connectors attached to the backsheet; and
a plurality of backsheet apertures, each aperture exposing portions of two of the shingle connectors on one side of the backsheet;
wherein each opening in the flexible substrate of one of the shingles is configured to be aligned with a respective one of the backsheet apertures when the shingles are disposed on the backsheet, thereby electrically connecting the shingle connectors of the backsheet to the positive and negative terminals of each shingle and electrically connecting the shingles to each other.

9. The photovoltaic module of claim 8, wherein the backsheet is a multi-layer backsheet and the electrically conductive shingle connectors are disposed between layers of the backsheet.

10. The photovoltaic module of claim 9, wherein the backsheet includes two polymer films adhered together, and the electrically conductive shingle connectors are disposed between the two films.

11. The photovoltaic module of claim 8, wherein adjacent backsheet openings are laterally staggered to allow the shingles to be disposed on the backsheet in a laterally staggered pattern.

12. The photovoltaic module of claim 8, further comprising means for electrically connecting the exposed portions of the shingle connectors and the positive and negative terminals of each shingle.

13. The photovoltaic module of claim 8, wherein each shingle includes an attachment area extending along an upper edge of the shingle and each shingle is configured only to be attached to the backsheet at its respective attachment area, thereby allowing an unattached portion of each shingle to be lifted up away from the backsheet.

14. The photovoltaic module of claim 8, wherein the electrically conductive shingle connectors exposed by each backsheet opening terminate at end portions configured to align with the positive and negative terminals of each corresponding shingle.

15. A photovoltaic module comprising:
a plurality of flexible photovoltaic shingles, each including:
a flexible substrate;
a plurality of photovoltaic cells disposed on one side of the substrate;
a plurality of conductive traces disposed between the substrate and the photovoltaic cells, the traces electrically interconnecting the photovoltaic cells and defining a positive terminal and a negative terminal associated with the interconnected cells; and
an opening formed in the flexible substrate on a side opposite the photovoltaic cells, the opening providing access to the positive and negative terminals; and
a multi-layer flexible backsheet including:
a plurality of electrically conductive shingle connectors disposed between layers of the backsheet; and
a plurality of backsheet apertures, each aperture exposing portions of two of the shingle connectors on one side of the backsheet;
wherein each opening in the flexible substrate of one of the shingles is configured to be aligned with a respective one of the backsheet apertures when the shingles are disposed on the backsheet, thereby electrically connecting the shingles to each other.

16. The photovoltaic module of claim 15, wherein the backsheet includes two polymer films adhered together, and the electrically conductive shingle connectors are disposed between the two films.

17. The photovoltaic module of claim 15, wherein adjacent backsheet openings are offset to allow the shingles to be disposed on the backsheet in an offset pattern.

18. The photovoltaic module of claim 15, further comprising an electrically conductive material chosen from the set consisting of electrically conductive tape, electrically conductive adhesive, solder, conventional welds, and laser welds disposed between the exposed portions of the shingle connectors and the positive and negative terminals of each shingle.

19. The photovoltaic module of claim 15, wherein each shingle includes an attachment area extending along an upper edge of the shingle and each shingle is configured only to be attached to the backsheet at its respective attachment area, thereby allowing an unattached portion of each shingle to be lifted up away from the backsheet.

20. The photovoltaic module of claim 15, wherein the electrically conductive shingle connectors exposed by each backsheet opening terminate at end portions configured to align with the positive and negative terminals of each corresponding shingle.

* * * * *